US009425130B2

(12) United States Patent
Leung et al.

(10) Patent No.: US 9,425,130 B2
(45) Date of Patent: Aug. 23, 2016

(54) PACKAGE WITH MULTIPLE I/O SIDE-SOLDERABLE TERMINALS

(71) Applicant: NXP B.V., Eindhoven (NL)

(72) Inventors: Chi Ho Leung, Kowloon (HK); Wai Hung William Hor, Tsuen Wan (HK); Soenke Habenicht, Hamburg (DE); Pompeo Umali, Kwai Chung (HK); WaiKeung Ho, Kwai Chung (HK); Yee Wai Fung, Kwai Chung (HK)

(73) Assignee: NXP B.V., Eindohven (NL)

( * ) Notice: Subject to any disclaimer, the term of this patent is extended or adjusted under 35 U.S.C. 154(b) by 73 days.

(21) Appl. No.: 14/527,365

(22) Filed: Oct. 29, 2014

(65) Prior Publication Data

US 2016/0126162 A1 May 5, 2016

(51) Int. Cl.
*H01L 21/56* (2006.01)
*H01L 23/495* (2006.01)
*H01L 23/31* (2006.01)

(52) U.S. Cl.
CPC .... *H01L 23/49537* (2013.01); *H01L 23/49562* (2013.01); *H01L 23/49575* (2013.01); *H01L 21/561* (2013.01); *H01L 23/3107* (2013.01)

(58) Field of Classification Search
CPC .......... H01L 2224/48091; H01L 2224/48247; H01L 2924/01079; H01L 2924/14; H01L 2924/01029; H01L 29/00; H01L 29/01; H01L 29/14; H01L 21/56
USPC .................................................. 257/676–678
See application file for complete search history.

(56) References Cited

U.S. PATENT DOCUMENTS 8,525,305 B1* 9/2013 Rogren ............. H01L 23/49541
257/666

* cited by examiner

*Primary Examiner* — Monica D Harrison
(74) *Attorney, Agent, or Firm* — Rajeev Madnawat (57) ABSTRACT

Consistent with an example embodiment, there is leadless packaged semiconductor device having top and bottom opposing major surfaces and sidewalls extending there between. The leadless packaged semiconductor device comprises a lead frame sub-assembly having an array of two or more lead frame portions each having a semiconductor die arranged thereon. There are at least five I/O terminals wherein each of said terminals comprise a respective metal side pad wherein the respective metal side pad is disposed in a recess. A feature of this embodiment is that the each of the side pads is electroplated. The electroplated side pads accept solder and the solder menisci are contained by the recesses.

13 Claims, 7 Drawing Sheets

PACKAGE WITH MULTIPLE I/O SIDE-SOLDERABLE TERMINALS

FIELD

This disclosure relates to integrated circuit (IC) packaging. More particularly, this disclosure relates to a leadless packaged semiconductor device and a method of making thereof.

BACKGROUND

The electronics industry continues to rely upon advances in semiconductor technologies to realize higher-function devices in more compact areas. For many applications realizing higher-functioning devices requires integrating a large number of electronic devices into a single silicon wafer. As the number of devices per given area of the silicon wafer increases, the manufacturing process becomes more difficult.

Many varieties of semiconductor devices have been manufactured having various applications in numerous disciplines. Such silicon-based semiconductor devices often include metal-oxide-semiconductor field-effect transistors (MOSFET), such as p-channel MOS (PMOS), n-channel MOS (NMOS) and complementary MOS (CMOS) transistors, bipolar transistors, BiCMOS transistors. Such MOSFET devices include an insulating material between a conductive gate and silicon-like substrate; therefore, these devices are generally referred to as IGFETs (insulated-gate FET).
Having manufactured a number of electronic devices on a wafer substrate, a particular challenge is to package these devices for their given purpose. As the complexity of portable systems increases, there is a commensurate need to reduce the size, enhance the electrical performance, and enhance the thermal performance of the individual components which make up the system as the device often is laid out on a printed circuit substrate. There is a need for packaging which can address these challenges.

SUMMARY

The present disclosure has been found useful in addressing the challenges packaging of semiconductor devices used in portable systems. Leadless packaged semiconductor devices are known to provide advantages over leaded packages. These leadless packages are often soldered onto printed circuit board (PCB) subsystems. However, it is sometimes problematic to monitor and control the quality of the solder connection between the device's underside I/O terminals, which have been plated to enhance solderability, and their corresponding PCB pad. By having a solderable surface present on visible vertical faces of the I/O terminals, the user may observe the wicking of solder upon the vertical face and as the solder cools and hardens, he may note a meniscus of solder indicating a mechanical and electrical connection of sufficient quality.

By design of a lead frame sub-assembly which assures that the vertical faces are unobstructed by lead frame connection bars and the like, incorporated with an indexed laser, it is possible to prepare devices having fully exposed vertical faces on the I/O terminals. The indexed laser makes openings along the vertical faces of the I/O terminals so that they may be completely electroplated with a solderable surface. The openings can be made in outer I/O terminals and those inner I/O terminals situated between the outer terminals by incorporating offset geometry for those inner I/O terminals.

In an example embodiment, there is leadless packaged semiconductor device having top and bottom opposing major surfaces and sidewalls extending there between. The leadless packaged semiconductor device comprises a lead frame sub-assembly having an array of two or more lead frame portions each having a semiconductor die arranged thereon. There are at least five I/O terminals wherein each of said terminals comprise a respective metal side pad and the respective metal side pad is disposed in a recess.

In another example embodiment, there is a method for forming a semiconductor device in a leadless chip carrier (LCC) having a lead frame assembly having an array of lead frame sub-assemblies, each having a device die arranged thereon, the sub-assemblies having I/O terminals electrically connected to the device die, the I/O terminals mutually connected by a connection bar, and middle I/O terminal, located between two other I/O terminals, has an offset geometry. The method comprises encapsulating the lead frame assembly and the I/O terminals in a molding compound; in a first direction in a series of parallel cuts, laser cutting the molding compound covering the I/O terminals, to a depth of the connection bar, exposing vertical surfaces of the I/O terminals and forming a recess surrounding each one of the I/O terminals, the offset geometry making space for the laser cutting so that vertical surface of the middle I/O terminal may be exposed. The I/O terminals are electroplated to form plated vertical surfaces. An additional series of cuts is performed by cutting in the first direction extending through the connection bars and the molding compound. In a second direction, a series of parallel cuts is performed, the second direction angled with respect to the first direction; the second series of cuts extend through the lead frame assembly and molding compound to singulate an individual device from the lead frame assembly.

In an example embodiment, a lead frame sub-assembly for a leadless chip carrier (LCC), comprises, a first sub-assembly portion including, a first die-attach landing; a first set of I/O terminals for connection of an IC device attached to the first die-attach landing; a first connection bar boundary of the first sub-assembly portion mechanically and electrically connecting the first die-attach landing and the first set of I/O terminals to one another. A second-sub-assembly portion includes a second die-attach landing, a second set of I/O terminals for connection of another IC device attached to the second die-attach landing; a second connection bar boundary of the second sub-assembly portion mechanically and electrically connecting the second die-attach landing and the second set of I/O terminals to one another. An intermediate sub-assembly portion includes a first intermediate set of I/O terminals for connection to the IC device or the other IC device; a first intermediate connection bar boundary connecting each one of the set respective intermediate I/O terminals, the first intermediate connection bar boundary is mechanically and electrically connected to the first connection bar boundary and the second connection bar boundary, the first intermediate connection bar boundary having an offset geometry toward a center point of the sub-assembly with respect to the first connection bar boundary and the second connection bar boundary; the first set of I/O terminals, the second set of I/O terminals, and the intermediate set of I/O terminals are co-linear with one another and vertical faces of the first set, second set and intermediate set of I/O terminals are not obstructed.

The above summaries of the present invention are not intended to represent each disclosed embodiment, or every aspect, of the present invention. Other aspects and example embodiments are provided in the figures and the detailed description that follow.

BRIEF DESCRIPTION OF THE DRAWINGS

The invention may be more completely understood in consideration of the following detailed description of various embodiments of the invention in connection with the accompanying drawings, in which.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present disclosure has been found useful in addressing the challenges packaging of semiconductor devices used in portable systems. Leadless packaged semiconductor devices are known to provide advantages over leaded packages. Those advantages include better electrical performance in terms of reduced lead inductance, good heat dissipation by use of an exposed thermal pad to improve heat transfer to a PCB (printed circuit board), reduced package thickness and smaller footprint, which reduces the area occupied on a PCB. Examples of leadless packaged semiconductor devices include QFN (quad-flat no-lead devices) and DFN (discrete-flat no-lead devices). However, a disadvantage of leadless packaged semiconductor devices is that inspection of solder joints when mounted on a PCB can be difficult. Conventional inspection techniques utilize so-called Automated Optical Inspection (AOI) systems, whereby a camera scans the leadless packaged semiconductor devices mounted on the PCB for a variety of defects such as open circuit connections, short circuit connections, thinning of the solder connections and incorrectly placed devices. Due to the semiconductor device I/O terminals being arranged on the bottom of the device, and therefore hidden from view when the device is mounted a PCB, it is not generally possible to use AOI systems with leadless semiconductor devices. Automatic X-Ray Inspection (AXI) systems may allow inspection of solder joints, however AXI systems are expensive.

A solution allowing solder joints to be inspected by AOI is to include a metal side pads which extend from the device I/O terminals on the bottom of the device at least partially up external sidewall of the device. Typically the metal side pads may be formed of tin, lead or tin-lead alloys. During soldering processes attaching the device to the PCB, the solder will wet the I/O terminal on the bottom of the device and also the metal side pads. As a result a portion of the solder joint will be visible allowing inspection by AOI techniques. The solder joint may be considered good, provided that the metal side pads are correctly soldered even if the I/O terminal is not correctly soldered to the PCB.

In addition to ease of inspection, metal side pads may reduce tilting of the device when mounted on a PCB. Metal side pads may also improve shearing and bending performance because of the increased soldered area.

In an example embodiment, a package structure comprises an array of device dies embedded in an encapsulation layer. The device dies are connected to a lead frame by any appropriate technique, such as eutectic bonds. The process of forming a such leadless device involves dividing a two dimensional array of encapsulated integrated circuits into individual semiconductor device packages using a series of parallel row cuts and parallel column cuts. The first series of parallel cuts extend fully through the lead frame and encapsulation layer defining rows of the array.

After electro-plating metal side pads, a second series of parallel cuts is made extending fully through the lead frame and encapsulation layer. This separates the columns of the array thereby providing singulated packages. In such a process the I/O terminals will be exposed and since the I/O terminals are mutually electrically connected the exposed I/O terminals may be electroplated to form the metal side pads. The electrical connection is necessary to maintain electrical continuity so that the electroplating process can be achieved.

However, for leadless semiconductor devices having two separate functional dies and at least three I/O terminals located at one sidewall of the device and at least two I/O terminals located at an opposing sidewall, it may not be possible to form side pads by electroplating according to above process because the cutting sequence requires that middle I/O terminals located at one sidewall of the device formed on a lead frame structure on lead frame be electrically isolated. Some I/O terminals after the first cut become isolated and cannot be electro-plated.

Further, for some leadless packages the number of I/O terminals is limited to three on packages of dimensions less than 1.1 mm×1.1 mm. For other leadless packages, the number of I/O terminals is limited to six for those package sizes larger than 2 mm×2 mm.

Consistent with an example embodiment, there is a method that may be applied to leadless packages having side-solderable I/O terminals whose number is not limited.

In an example embodiment, a lead frame assembly, having an array of device positions, has been re-designed such that interconnects (i.e., connection bars) mechanically and electrically coupling the I/O terminals to together do not mar vertical faces of the terminals and leave them fully exposed so that they may receive electroplating during the assembly process. One or more devices are die attached to die attach regions on the lead frame assembly. Conductive bonds connect the device I/O pads with the I/O terminals. These bonds may be wire bonds or conductive tape or ribbon bonds. After die attach and conductive bonding, the devices are encapsulated in a molding compound. With a laser tuned to cut through molding compound, the molding compound enveloping the vertical faces of the I/O terminals is removed. The laser beam is indexed through the rows of device positions. The indexing of the laser beam may also be referred to as a "chopper cut." For a given device, the laser removes the molding compound enveloping the vertical face of a first outside I/O terminal; next, the laser is indexed to an inner I/O terminal and likewise, removes the molding compound enveloping the vertical face of the inner I/O terminal. After the inner I/O terminal's vertical face is exposed, the laser indexes to a second outside I/O terminal, removes the molding compound enveloping the vertical face of the second outside I/O terminal.

The vertical faces of the I/O terminals are free of any blemishes, in that no connection bar couples the I/O terminals from the exposed vertical surfaces. In particular, the inner I/O terminal's connection bar has an offset so as to provide an unobstructed path for the laser beam. The connection bars couple to I/O terminal vertical faces not exposed.

After all of the I/O rows have been laser chopper cut, the lead frame assembly with the array of devices undergoes an electroplating. Since, all the I/O terminals are electrically connected to one-another, all of the exposed surfaces of the I/O terminals and die attach pads on the device receive a plating. After the electroplating, the lead frame assembly, with the array of devices, is sawed apart to singulate individual devices.

Since the I/O terminals have plating on their underside and vertical surfaces, soldering of the individual device onto a printed circuit board sub-system is facilitated. In accordance with the present disclosure, for an integrated circuit device assembled with the disclosed lead frame design and processed with the disclosed laser chopping assembly process, the vertical faces, now electroplated, facilitate cost-effective AOI inspection in contrast to LCC devices without solderable vertical I/O surfaces. As a result of the chopper cut, the exposed vertical faces are recessed in the molding compound.

Figure 1A:
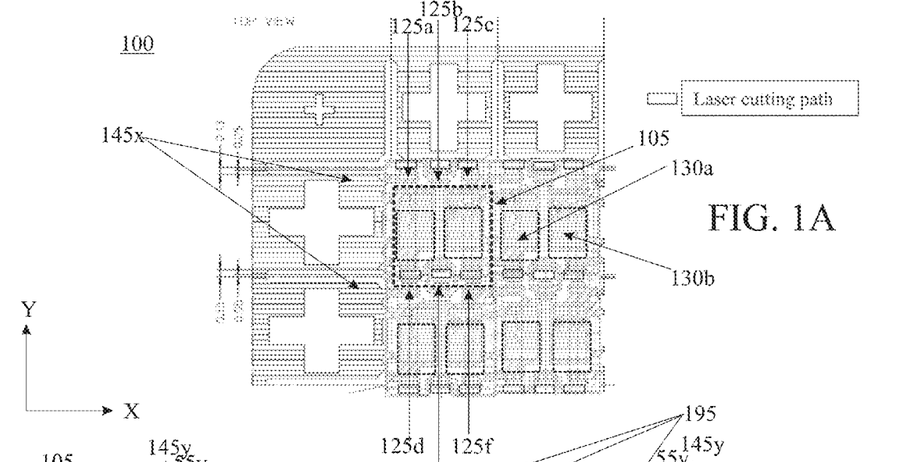
FIGS. 1A-1B are underside views of an a lead frame having modified terminal interconnects according to an embodiment of the present disclosure.

Refer to FIG. 1A. In accordance with an embodiment of the present disclosure, there is lead frame assembly 100 with an array of lead frame sub-assemblies having device positions 105, whose I/O terminals have been arranged so that during assembly their vertical faces may be exposed for electroplating. Each device position 105 has component pieces of two die attach regions 130*a* and 130*b* on the opposite side of the underside of the lead frame assembly 100. Other component pieces of co-linear I/O terminals 125*a*, 125*b*, 125*c* are on one side of the device position and co-linear I/O terminals 125*d*, 125*e*, and 125*f* are on the opposite side. Connection bars 145*x* and 145*y*, in X and Y directions respectively, electrically and mechanically couple the component pieces of each device position 105 during integrated device assembly. Laser cutting paths 195 are located in unobstructed areas between the I/O terminals 125*a-e* and the connection bar 145*x*. During assembly, the laser cuts through molding compound in these unobstructed areas (as shown by the rectangles). Rather than a continuous cut, the laser performs a chopper cut.

Figure 1B:
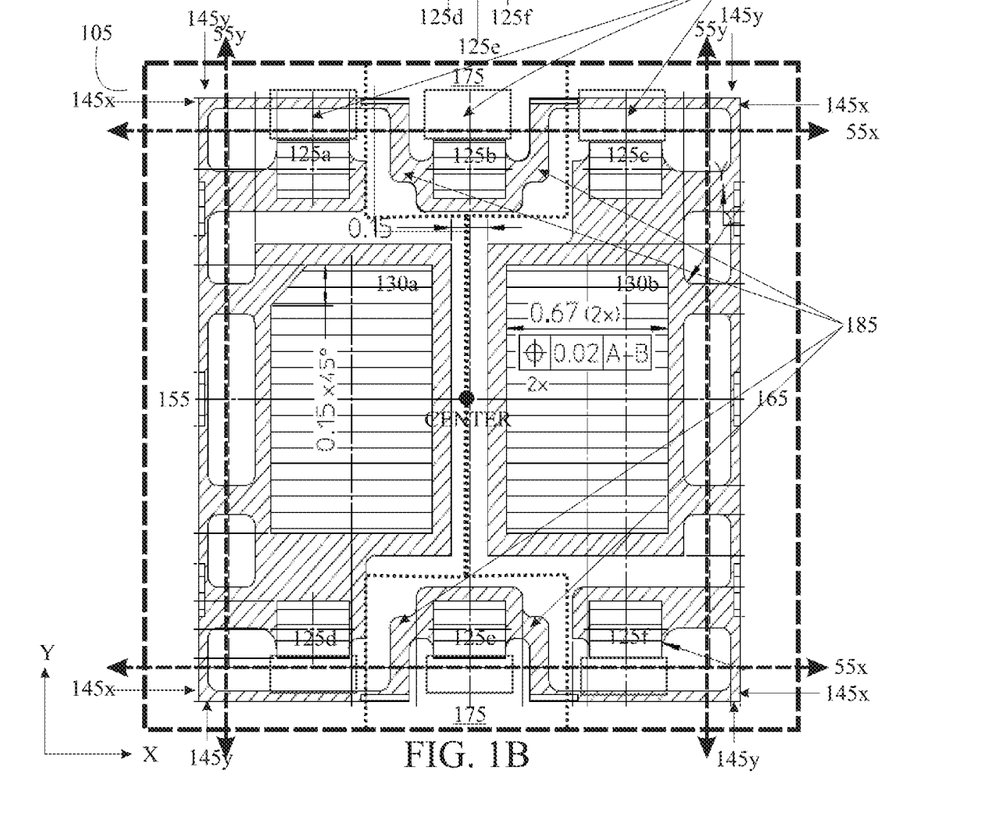

Refer to FIG. 1B. In an underside view, the lead frame assembly 100 has been arranged so as to provide unobstructed path for the laser chopper cut. Looking at a detailed view of device position 105, the device position is divided by dashed lines, into an outer first portion 155, and outer final portion 165, and an inner portion 175. Looking at the I/O terminals 125*a-f*, one can observe, that no connection bar is attached to an outer I/O terminal faces parallel in the X-direction (adjacent to the rectangles indicating the laser cutting path 195).

Looking in the inner portion 175 of device position 105, the I/O terminals 125*b* and 125*e*, their connection bar 145*x* has an offset geometry connection bar 185. This offset geometry 185 maintains the co-linear relationship between the inner portion I/O terminals 125*b* and 125*e* and provides an unobstructed opening 195 (as shown by the rectangles) for the laser chopper cut. The laser cuts through to depth at least the vertical thickness of the I/O terminals. When these outer terminal faces are exposed, they are unblemished and ready to accept electroplated metal.

The outer first portion 155 and outer final portion 165 sandwich the inner portion 175. The connection bar 145*x* is continuous and is electrically and mechanically coupled to the connection bar 145*y*. The connection bar 145*x* has the offset geometry 185 in the inner portion 175. The shape of the offset geometry 185 may be thought of as a serpentine shape (i.e., resembles the shape of a snake in motion), as it maintains the relationship between I/O terminal 125*b* (or 125*e*) and the I/O terminals 125*a* and 125*c* (or 125*d* and 125*f*). The connection bars 145*x* and 145*y* may be thought of as defining connection bar boundaries of the outer first portion 155, inner portion 175, and outer final portion 165. The beginnings and ends of the connection bar boundaries may be substantially defined by the saw cutting lines 55*x* and 55*y*.

After the laser chopper cut 195, the lead frame assembly 100 may be singulated along cutting lines 55*x* and 55*y*. The electrical and mechanical connections between the component pieces of the device positions 105 are broken. Any selvedge remaining (i.e., the remnants of the connection bars 145*x* and 145*y* from the cut-up lead frame assembly 100 may be reclaimed by known industrial processes.

In another example embodiment, the lead frame assembly 100 may have device positions 105 with more than one inner portion 175 having additional I/O terminals with suitable offset geometry 185.

Figure 1C:
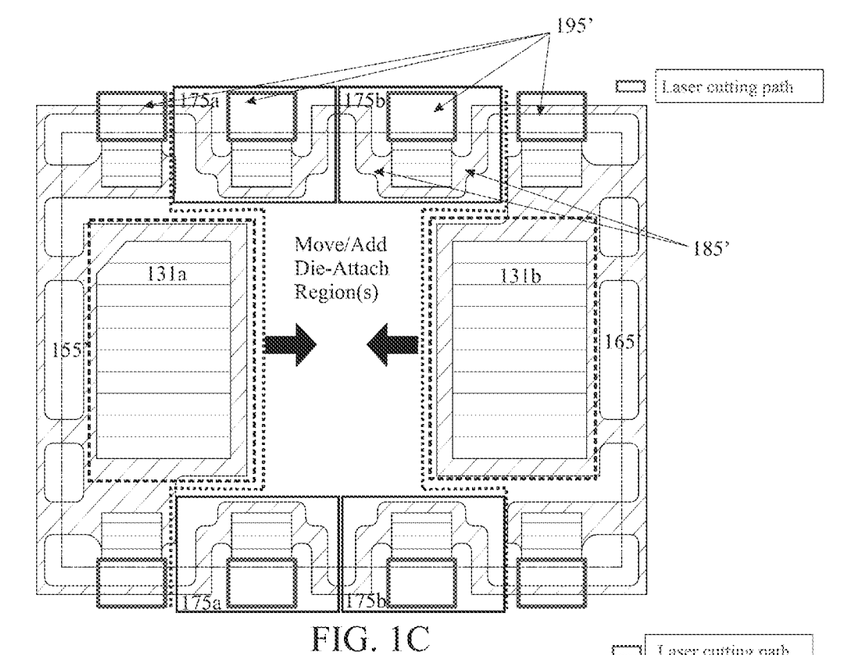
FIGS. 1C-1D are underside views of a lead frame having multiple modified terminal interconnects according to an embodiment of the present disclosure.

Refer to FIG. 1C. In an example embodiment, going in the X-direction, the device positions 105 may have two inner portions 175*a* and 175*b* with the suitable offset geometry 185'. Thus, the six-terminal device is increased to eight and these terminals may undergo the laser chopping process in unobstructed areas 195' to provide the eight terminals having exposed vertical faces that can be electroplated. In this embodiment, with the second inner portion 175*b*, the die pad areas 131*a* and 131*b* would be likely re-positioned so as to minimize the increased package area.

Figure 1D:
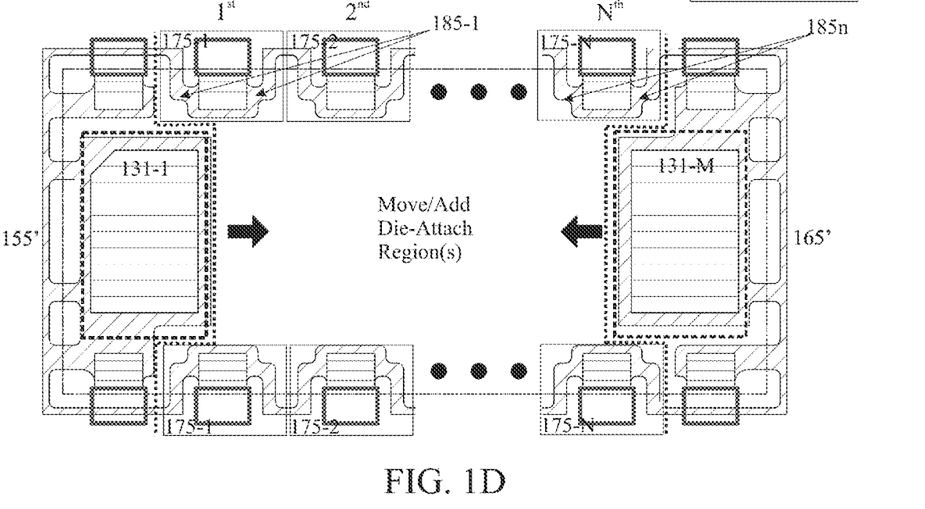

Refer to FIG. 1D. The present disclosure of having an inner portion 175 with the suitable offset geometry 185 may be expanded to N-number of inner portions. Die position 105 has a first (175-1), second (175-2), and Nth (175-N) inner portions. Having more terminal I/O pins may result in having die positions 131-1, 131-2 through 131-M. These additional die pad positions would require properly interconnection for lead frame electrical/mechanical integrity.

In another example embodiment according the present disclosure, additional I/O terminals with suitable offset geometry may be generated in the Y-direction, as well. The lead frame would be laid out so as to include additional I/O terminals with a minimally increased package area.

Figure 2A:
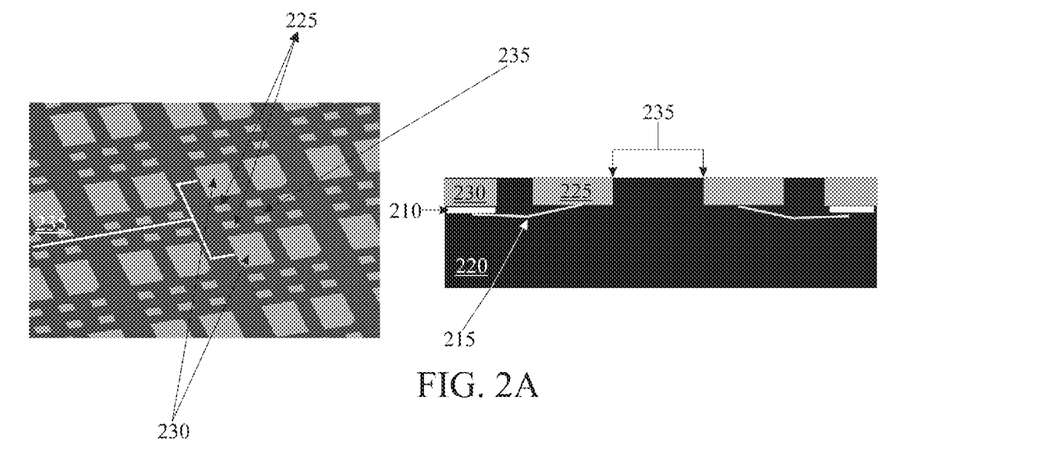
FIGS. 2A-2D are simplified cross-sectional and perspective views of the making of a device with the lead frame of FIGS. 1A-1B according to an embodiment of the present disclosure.
Figure 2B:
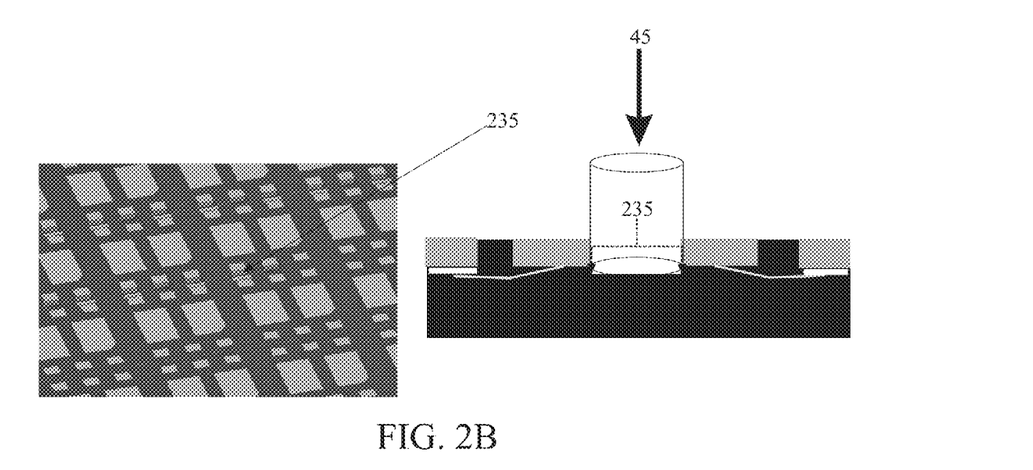
Figure 2C:
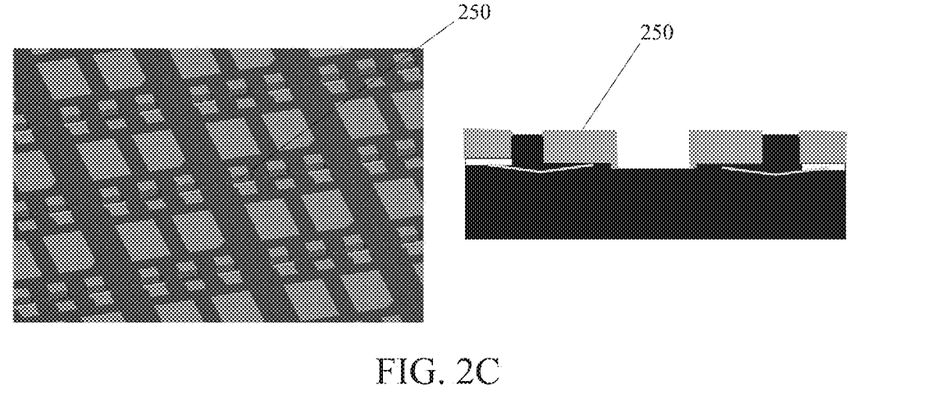
Figure 2D:
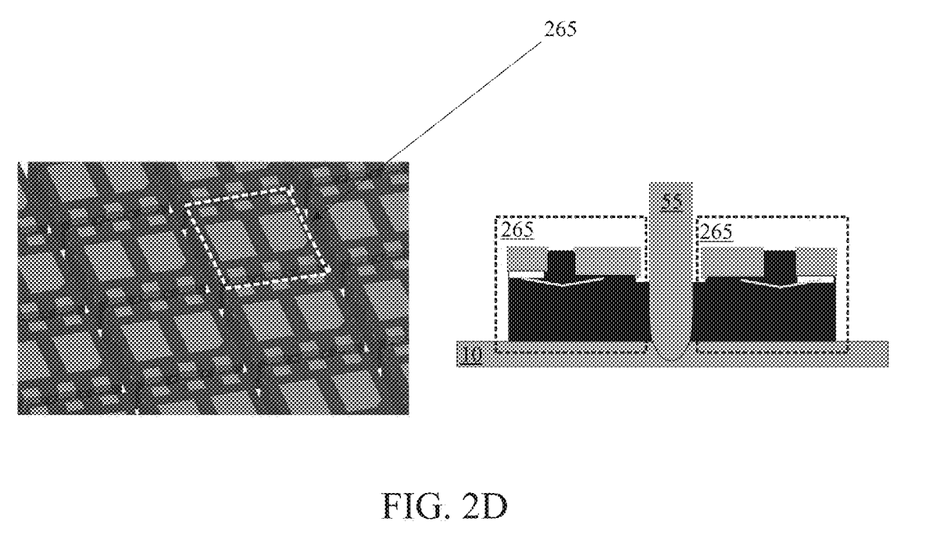

Refer to FIGS. 2A-2D. In a series of perspective and side views, the lead frame assembly 100, as has been described, undergoes assembly. Refer to FIG. 2A. Device die 210 have been attached to die attach pads 230 and have wire bonds 220 from the device die 210 to the I/O terminals 225. The device die are encapsulated in a molding compound 220. The spacing 135 between device die 210 is subjected to a laser chopper cut 45. The cut at least to depth of the vertical face of the I/O terminals 225. The vertical faces of the I/O terminals 225, now exposed, the device die 210 undergo electroplating with a suitable solderable metal. 250. After the electroplating, the device die 210 are put onto a flexible foil carrier 10 or equivalent. With a saw blade 55 of a suitable kerf, the device die 210 are singulated into individual devices 265.

Figure 3:
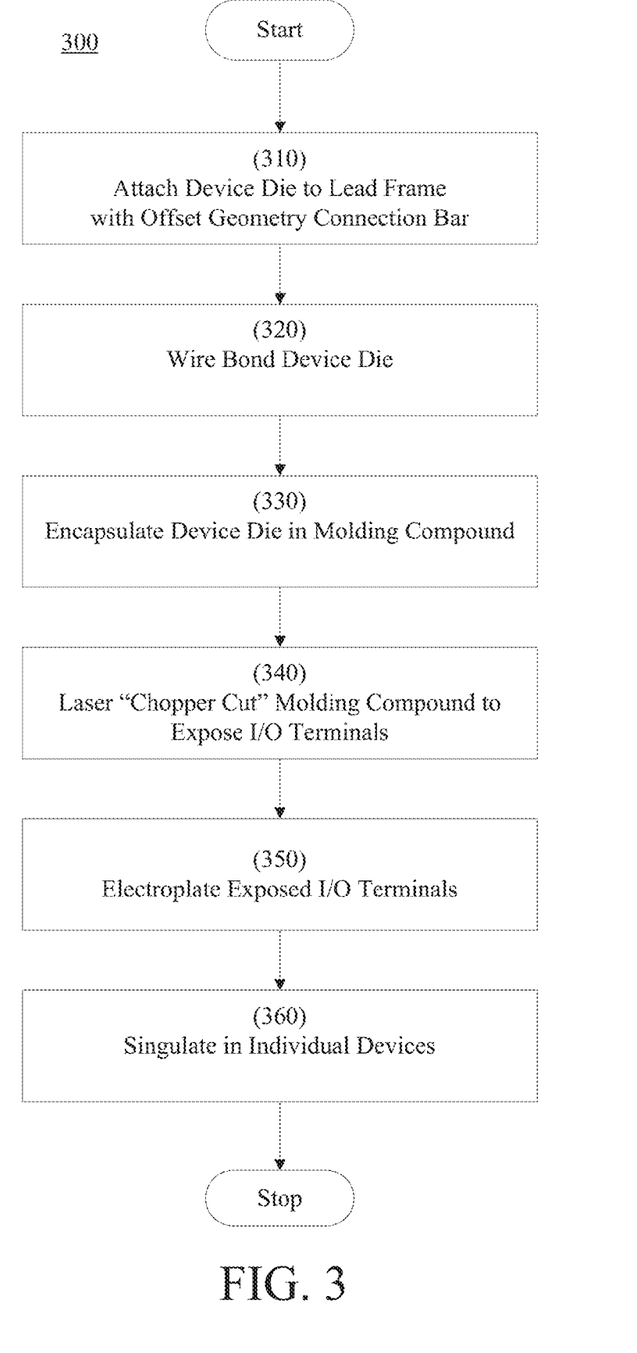
FIG. 3 is a flow diagram of an assembly process according to an embodiment of the present disclosure.

Refer to FIG. 3. In accordance with an example embodiment, devices using the disclosed lead frame assembly may be manufactured with the following process 300. In step 310, the device die are die-attached to a lead frame having the offset geometry connection bar. At step 320, the devices are wire bonded. In step 330, the device die are encapsulated in a molding compound. Following encapsulation in step 340, the lead frame assembly having encapsulated devices undergoes the laser chopper cut on the exposed underside so as to expose the vertical faces of the I/O terminals. In step 350, the exposed I/O terminals are electroplated. In step 360, the device die are singulated into individual IC devices.

Figures 4A, 4B, 4C:
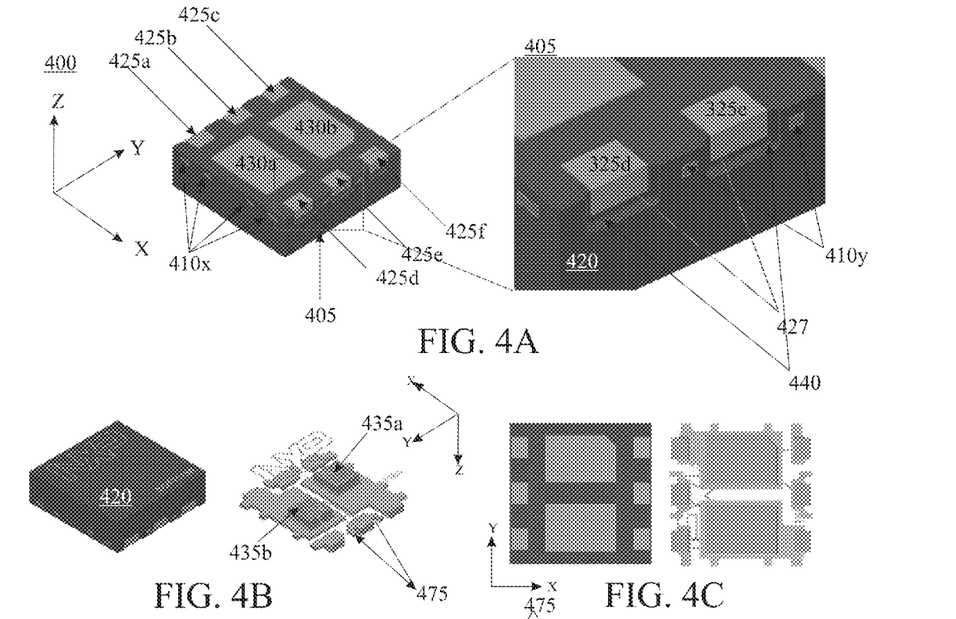
FIGS. 4A-4F are multiple views of an example lead frame in which a device has been assembled in a lead frame according to an embodiment of the present disclosure.
Figures 4D, 4E, 4F:
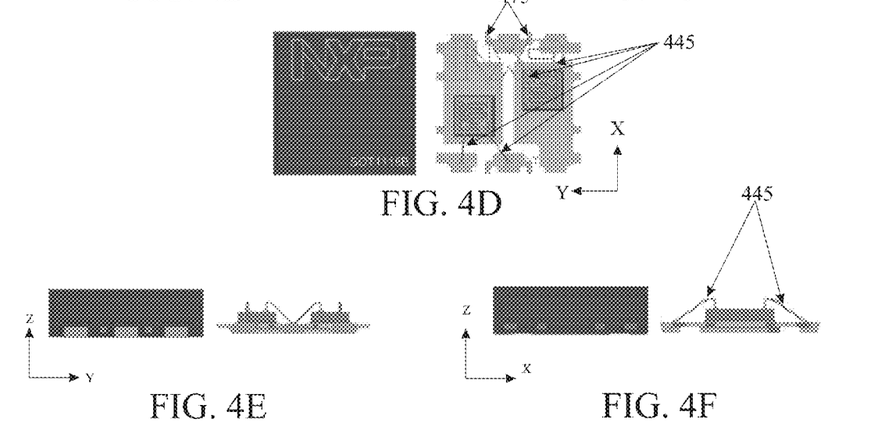

Refer to FIGS. 4A-4F. In a series of views a device 400, encapsulated in a molding compound 420, has been assembled with a lead frame and method according to the present disclosure. FIG. 4A, in a perspective underside view, device 400 has six electroplated I/O Terminals 425a-425f, two electroplated die attach areas 430a and 430b. In a close up view 405, the vertical faces 427 of I/O terminals 425d and 425e in recesses 440 in the molding compound 420. This is a feature of the laser chopper cut. The singulation sawing cuts through these laser cuts and leaves the exposed vertical faces within a recess. The recesses serve as containment for the solder, as the device is mounted onto a printed circuit board (PCB) sub-system. Further, the recesses may provide protection to the I/O terminals during pick and place handling during PCB mounting. Un-plated remnants 410x and 410y of the lead frame material are visible in the assembled device 400. Remaining views, FIGS. 4B-4F show the individual device die 335a and 335b electrically connected by wire bonds 445 to the I/O terminals 425a-f. Also, note the remaining portion 475 of the offset geometry connection bar. I/O terminals 425a-f and die attach areas 430a and 430b once electrically connected to one another by X and Y connection bars are now electrically isolated from one another and each I/O terminal is connected to corresponding regions on the device die 435a and 435b. Remnants of the offset geometry 475 is shown in FIG. 4B.

The present disclosure assures that an LCC device will achieve a electrically and mechanically robust solder connection between the LCC I/O terminals and printed circuit board.

Figure 5A:
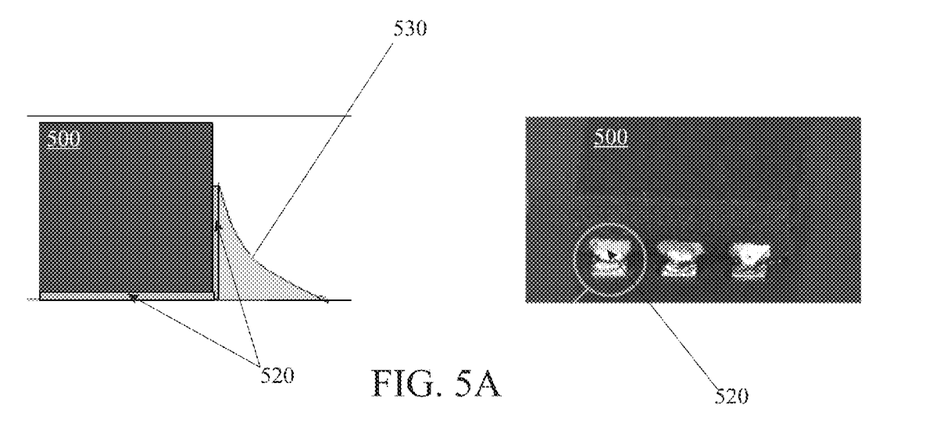
FIGS. 5A-5B show a pair of side views showing an example of the enhanced solderability of the I/O terminals for an example device assembled in accordance with the present disclosure.
Figure 5B:
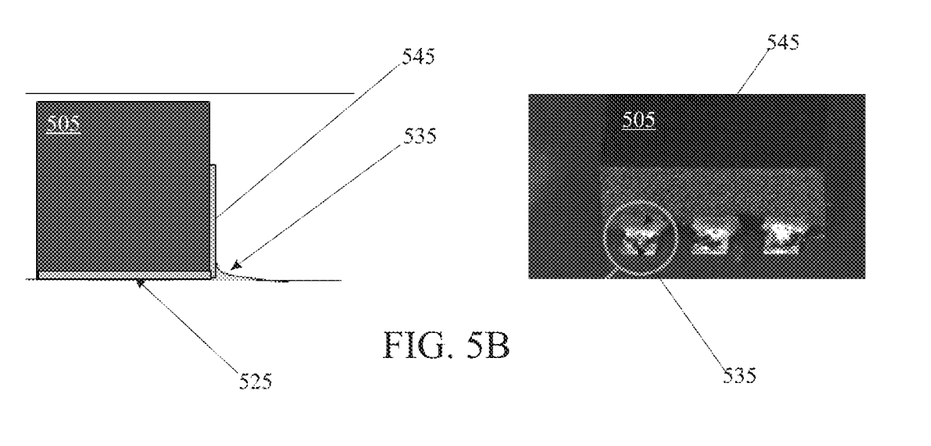

Refer to FIGS. 5A-5B. In FIG. 5A, a device 500 assembled according to the present disclosure has a tin plating 520 on the underside face and vertical face of the I/O terminal. The solder 530 wicks up from the underside and forms a meniscus which is readily visible through automated optical inspection. In contrast (FIG. 5B), a device 505 whose vertical face of the I/O terminals is un-plated copper 545. The solder 535 cannot form a visible meniscus which is readily visible through automated optical inspection. One cannot ascertain whether the solder join on the underside surface is sufficient without the use of more costly analysis.

While the above discussion relates to leadless packaged semiconductor devices having three or more I/O terminals on each opposing side of the device (that is arranged as a so-called dual in line arrangement), and with two or more electrically isolated die attach regions 130, the process can be used for multiple I/O terminal configurations and multiple electrically isolated die attach regions. The skilled person will appreciate that I/O terminals and die attached regions need to be electrically connected to each other after the first cut, so as to allow for electroplating and then mutually electrically separated so as to allow for correct functioning of the device dies and ultimately the final packaged device.

Various exemplary embodiments are described in reference to specific illustrative examples. The illustrative examples are selected to assist a person of ordinary skill in the art to form a clear understanding of, and to practice the various embodiments. However, the scope of systems, structures and devices that may be constructed to have one or more of the embodiments, and the scope of methods that may be implemented according to one or more of the embodiments, are in no way confined to the specific illustrative examples that have been presented. On the contrary, as will be readily recognized by persons of ordinary skill in the relevant arts based on this description, many other configurations, arrangements, and methods according to the various embodiments may be implemented.

To the extent positional designations such as top, bottom, upper, lower have been used in describing this disclosure, it will be appreciated that those designations are given with reference to the corresponding drawings, and that if the orientation of the device changes during manufacturing or operation, other positional relationships may apply instead. As described above, those positional relationships are described for clarity, not limitation.

The present disclosure has been described with respect to particular embodiments and with reference to certain drawings, but the invention is not limited thereto, but rather, is set forth only by the claims. The drawings described are only schematic and are non-limiting. In the drawings, for illustrative purposes, the size of various elements may be exaggerated and not drawn to a particular scale. It is intended that this disclosure encompasses inconsequential variations in the relevant tolerances and properties of components and modes of operation thereof. Imperfect practice of the invention is intended to be covered.

Where the term "comprising" is used in the present description and claims, it does not exclude other elements or steps. Where an indefinite or definite article is used when referring to a singular noun, e.g. "a" "an" or "the", this includes a plural of that noun unless something otherwise is specifically stated. Hence, the term "comprising" should not be interpreted as being restricted to the items listed thereafter; it does not exclude other elements or steps, and so the scope of the expression "a device comprising items A and B" should not be limited to devices consisting only of components A and B. This expression signifies that, with respect to the present disclosure, the only relevant components of the device are A and B.

Numerous other embodiments of the disclosure will be apparent to persons skilled in the art without departing from the spirit and scope of the disclosure as defined in the appended claims.

The invention claimed is:

1. A lead frame sub-assembly for a leadless chip carrier (LCC), comprising:
    a first sub-assembly portion including,
        a first die-attach landing;
        a first set of I/O terminals for connection of an IC device attached to the first die-attach landing;
        a first connection bar boundary of the first sub-assembly portion mechanically and electrically connecting the first die-attach landing and the first set of I/O terminals to one another;
    a second-sub-assembly portion including,
        a second die-attach landing
        a second set of I/O terminals for connection of another IC device attached to the second die-attach landing;
        a second connection bar boundary of the second sub-assembly portion mechanically and electrically connecting the second die-attach landing and the second set of I/O terminals to one another;
    an intermediate sub-assembly portion including,
        a first intermediate set of I/O terminals for connection to the IC device or the other IC device;

a first intermediate connection bar boundary connecting each one of the set respective intermediate I/O terminals, the first intermediate connection bar boundary is mechanically and electrically connected to the first connection bar boundary and the second connection bar boundary, the first intermediate connection bar boundary having an offset geometry toward a center point of the sub-assembly with respect to the first connection bar boundary and the second connection bar boundary, and wherein the first set of I/O terminals, the second set of I/O terminals, and the intermediate set of I/O terminals are co-linear with one another and vertical faces of the first set, second set and intermediate set of I/O terminals are not obstructed.

2. The lead frame sub-assembly as recited in claim 1, wherein the intermediate sub-assembly portion further includes, a second intermediate set of I/O terminals for connection to the IC device or the other IC device;

a second intermediate connection bar boundary connecting each one of the set of respective second intermediate I/O terminals, the second intermediate connection bar boundary is mechanically and electrically connected to the first intermediate connection bar boundary and the second connection bar boundary, wherein the second intermediate connection bar boundary has an offset geometry like that of the first intermediate connection bar boundary; and wherein the first set of I/O terminals, the second set of I/O terminals, and the first intermediate set of I/O terminals and the second intermediate set of I/O terminals are co-linear with one another and vertical faces of the first set, second set and intermediate sets of I/O terminals are not obstructed.

3. The lead frame sub-assembly as recited in claim 2, wherein the first intermediate connection bar boundary offset is a serpentine pattern and the second intermediate connection bar boundary offset is a serpentine pattern.

4. A lead frame assembly comprising an array of lead frame sub-assemblies as recited in claim 1.

5. A method for forming a semiconductor device in a leadless chip carrier (LCC) having a lead frame assembly having an array of lead frame sub-assemblies, each having a device die arranged thereon, the sub-assemblies having I/O terminals electrically connected to the device die, the I/O terminals mutually connected by a connection bar, and middle I/O terminal, located between two other I/O terminals, has an offset geometry, the method comprising:

encapsulating the lead frame assembly and the I/O terminals in a molding compound;

in a first direction in a series of parallel cuts, laser cutting the molding compound covering the I/O terminals, to a depth of the connection bar, exposing vertical surfaces of the I/O terminals and forming a recess surrounding each one of the I/O terminals, the offset geometry making space for the laser cutting so that vertical surface of the middle I/O terminal may be exposed;

electroplating the I/O terminals to form plated vertical surfaces;

performing an additional series of cuts, cutting in the first direction extending through the connection bars and the molding compound; and performing in a second direction in a series of parallel cuts, the second direction angled with respect to the first direction, the second series of cuts extending through the lead frame assembly and molding compound to singulate an individual device from the lead frame assembly.

6. The method as recited in claim 5, where in each of the sub-assemblies comprises at least six terminals and wherein at least three I/O terminals are disposed on one side of a lead frame sub-assembly and the remaining three I/O terminals are on an opposite side of the lead frame sub-assembly.

7. The method as recited in claim 5, wherein each of lead frame sub-assemblies has at least two separate die attach regions.

8. A leadless packaged semiconductor device having top and bottom opposing major surfaces and sidewalls extending there between, the leadless packaged semiconductor device comprising:

a lead frame sub-assembly having an array of two or more lead frame portions each having a semiconductor die arranged thereon;

at least five I/O terminals wherein each of said terminals comprise a respective metal side pad; and wherein the respective metal side pad is disposed in a recess such that the respective metal side pad is partially below a surface and remaining above the surface.

9. The leadless packaged semiconductor device as recited in claim 8, wherein the I/O terminals are disposed on opposing side walls, wherein at least two I/O terminals are disposed on one of said sidewalls and the remaining I/O terminals are disposed on an opposing side wall.

10. The leadless package semiconductor device as recited in claim 9, wherein each of metal side pads are electroplated.

11. The leadless package semiconductor device as recited in claim 9, wherein an I/O terminal between two other I/O terminals has remnants of an offset geometry structure.

12. The leadless packaged semiconductor device as recited in claim 8, wherein each of the lead frame portions comprise a die attach region including therewith an integrally formed terminal.

13. The leadless package semiconductor device as recited in claim 8 wherein each of two or more lead frame portions are electrically isolated.

* * * * *